United States Patent [19]

Sugata et al.

[11] Patent Number: 4,851,808
[45] Date of Patent: Jul. 25, 1989

[54] HEAT-GENERATING RESISTOR AND HEAT-GENERATING RESISTANCE DEVICE BY USE OF SAID HEAT-GENERATING RESISTOR

[75] Inventors: Masao Sugata, Yokohama; Tatsuo Masaki, deceased, late of Yokohama, by Yoshiko Masaki, legal representative; Hirokazu Komuro; Shinichi Hirasawa, both of Hiratsuka; Yasuhiro Yano, Kawasaki, all of Japan

[73] Assignee: Canon Kabushiki Kaisha, Tokyo, Japan

[21] Appl. No.: 841,269

[22] Filed: Mar. 19, 1986

[30] Foreign Application Priority Data

Mar. 22, 1985 [JP] Japan .................................. 60-55655
Mar. 23, 1985 [JP] Japan .................................. 60-58844
Mar. 23, 1985 [JP] Japan .................................. 60-58846
Mar. 25, 1985 [JP] Japan .................................. 60-58528

[51] Int. Cl.[4] ............................................. H01C 1/012
[52] U.S. Cl. ..................................................... 338/308

[58] Field of Search ................................. 338/306–308, 338/309; 427/101–103, 294; 219/544, 543, 216; 156/659.1; 252/518, 519

[56] References Cited

U.S. PATENT DOCUMENTS 4,414,274 11/1983 Hieber ............................ 338/308 X

FOREIGN PATENT DOCUMENTS 0071082 2/1983 European Pat. Off. .
3411702 10/1984 Fed. Rep. of Germany .
3316182 11/1984 Fed. Rep. of Germany .
3041420 1/1985 Fed. Rep. of Germany .
1410876 10/1975 United Kingdom .
1582231 1/1981 United Kingdom .
2083841 3/1982 United Kingdom .
2109012 5/1983 United Kingdom .

Primary Examiner—E. A. Goldberg
Assistant Examiner—M. M. Lateef
Attorney, Agent, or Firm—Fitzpatrick, Cella, Harper & Scinto

[57] ABSTRACT

A heat-generating resistor, having a functional thin film comprising an amorphous material containing hydrogen atoms in a matrix of carbon atoms formed on a substrate.

50 Claims, 3 Drawing Sheets

HEAT-GENERATING RESISTOR AND HEAT-GENERATING RESISTANCE DEVICE BY USE OF SAID HEAT-GENERATING RESISTOR

BACKGROUND OF THE INVENTION

1. Field of the Invention

This invention relates to a heat-generating resistor and a heat-generating resistance device by use of said heat-generating resistor, particularly to a thin film heat-generating resistor having a resistance thin film as the functional element on a substrate surface and a heat-generating resistance device by use of said heat-generating resistor.

Such a resistor can be used suitably as an electricity-heat energy converting device in various electronic instruments and electrical instruments.

2. Description of the Prior Art

In the prior art, the heat-generating resistors employed as relatively small electricity-heat energy converting devices in electronic instruments or electrical instruments included the thin film type, the thick film type and the semiconductor type. Among these, the thin film type can be smaller in power consumption as compared with other types and also relatively better in heat response, and therefore tends to be increasingly applied.

The performances demanded for such a heat-generating resistor are good response of heat generation to a given electrical signal, good thermal conductivity, good heat resistance to heat generation by itself and various durabilities (e.g. durability against heat history).

In the conventional thin film type heat-generating resistors, the above performances are not satisfactory and further improvements of the characteristics are desired.

SUMMARY OF THE INVENTION

In view of the prior art as described above, an object of the present invention is to provide a thin film heat-generating resistor improved in heat response.

Another object of the present invention is to provide a thin film heat-generating resistor improved in thermal conductivity.

Still another object of the present invention is to provide a thin film heat-generating resistor improved in heat resistance.

Still another object of the present invention is to provide a thin film heat-generating resistor improved in durability.

According to an aspect of the present invention, there is provided a thin film heat-generating resistor, having a functional thin film comprising an amorphous material containing hydrogen atoms in a matrix of carbon atoms formed on a substrate.

According to another aspect of the present invention, there is provided a heat-generating resistance device, having a functional thin film and a pair of electrodes electrically connected to said thin film, said thin film being a heat-generating resistor comprising an amorphous material containing hydrogen atoms in a matrix of carbon atoms formed on a substrate.

DETAILED DESCRIPTION OF THE PREFERRED EMBODIMENTS

Figure 1:
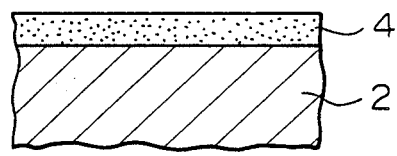
FIG. 1 and FIG. 2 are partial sectional views of the heat-generating resistor of the present invention.

Referring now to the drawings, the present invention is described in more detail.

FIG. 1 is a partial sectional view showing the construction of an embodiment of the heat-generating resistor of the present invention.

In this Figure, 2 is a substrate and 4 is a thin film for realizing functionality, namely resistance.

The material for the substrate 2 is not particularly limited in the present invention, but it is preferable in practice to use a material which is good in adhesion to the functional thin film to be formed on its surface, and also good in resistance to heat during formation of said functional thin film 4 and to the heat generated on said functional thin film during usage. Also, the substrate 2 preferably has an electrical resistance greater than that of the functional thin film to be formed on its surface. Further, in the present invention, depending on the purpose of use of the resistor, a substrate 2 with small thermal conductivity or great thermal conductivity may be used.

Examples of the substrate 2 to be used in the present invention may include those comprising inorganic materials such as glass, ceramic, silicon, etc. and organic materials such as polyamide resin, polyimide resin, etc.

In the present invention, the functional thin film 4 comprises an amorphous material containing hydrogen atoms in a matrix of carbon atoms.

The content of hydrogen atoms in the functional thin film 4 may be suitably selected depending on the purpose of use of the resistor so that desired characteristics may be obtained, but it is preferably 0.0001 to 30 atomic %, more preferably 0.0005 to 20 atomic %, optimally 0.001 to 10 atomic %.

The functional thin film comprising an amorphous material containing hydrogen atoms in a matrix of carbon atoms (hereinafter sometimes abbreviated as "a—C:H") in the heat-generating resistor of the present invention can be formed according to a plasma CVD method such as the glow discharge method or a vacuum deposition method such as the sputtering method.

For example, for formation of the thin film 4 comprising a—C:H according to the glow discharge method, the basic process may comprise arranging the substrate 2 in a deposition chamber under reduced pressure, introducing a starting gas for C supply capable of supplying carbon atoms (C) and a starting gas for H supply capable of supplying hydrogen atoms (H) into said deposition chamber, while changing the amount of the starting gas for H supply introduced in the case of distributing nonuniformly hydrogen atoms, and exciting glow discharging by use of high frequency or microwave energy in said deposition chamber thereby to form a layer comprising a—C:H on the surface of the substrate 2.

On the other hand, for formation of the thin film comprising a—C:H according to the sputtering method, the basic process may comprise arranging the substrate 2 in a deposition chamber under reduced pressure, introducing a starting gas for H supply into the deposition chamber and carrying out sputtering of a target constituted of C in an atmosphere of an inert gas such as Ar, He or the like, or a gas mixture based on these gases in said deposition chamber. Also, for distributing nonuniformly hydrogen atoms, the amount of the starting gas for H supply introduced into the deposition chamber may be changed.

In the present invention, the functional thin film 4 may also contain, besides hydrogen atoms, a substance for controlling electroconductivity. For the substance for controlling electroconductivity, there may be utilized the so-called impurities in the field of semiconductors, namely p-type impurities giving p-type conduction characteristics and n-type impurities giving n-type conduction characteristics. As the p-type impurities, the atoms belonging to group III of the periodic table such as B, Al, Ga, In, and Tl, may be included, particularly preferably B and Ga. As the n-type impurities, the atoms belonging to group V of the periodic table such as P, As, Sb, and Bi may be included, particularly P and As. These can be used either singularly or in plural combination.

The content of hydrogen atoms, when a substance for controlling electroconductivity is employed, may be selected suitably depending on the purpose of use so that desired characteristics may be obtained, similarly as described above, and its content may be within the same range as specified above.

On the other hand, the content of the substance for controlling electroconductivity in the functional thin film 4 may be selected suitably so as to obtain desirable characteristics depending on the purpose of use of the resistor, but it may preferably be 0.01 to 50000 atomic ppm, more preferably 0.5 to 10000 atomic ppm, optimally 1 to 5000 atomic ppm.

Also the functional thin film 4 comprising an amorphous material containing hydrogen atoms and a substance for controlling electroconductivity in a matrix of carbon atoms (hereinafter sometimes abbreviated as "a—C:H(p,n)"; here, (p,n) represents a substance for controlling electroconductivity), in the heat-generating resistor of the present invention, can be formed similarly as described above according to a plasma CVD method such as the glow discharge method or a vacuum deposition method such as the sputtering method.

For example, for formation of the thin film 4 comprising a—C:H(p,n) according to the glow discharge method, the basic process may comprise arranging the substrate 2 in a deposition chamber under reduced pressure, introducing a starting gas for C supply capable of supplying carbon atoms (C), a starting gas for H supply capable of supplying hydrogen atoms (H), and a starting gas for supply of a substance for controlling electroconductivity into said deposition chamber, while changing the amount of the starting gas for H supply and/or the substance for controlling electroconductivity introduced in the case of distributing nonuniformly the content of hydrogen atoms and/or the substance for controlling electroconductivity, and exciting glow discharging by use of high frequency or microwave energy in said deposition chamber thereby to form a layer comprising a—C:H(p,n) on the surface of the substrate 2.

On the other hand, for formation of the thin film 4 comprising a—C:H(p,n) according to the sputtering method, the basic process may comprise arranging the substrate 2 in a deposition chamber under reduced pressure and introducing a starting gas for H supply and a starting gas for supplying a substance for controlling electroconductivity into the deposition chamber, or alternatively introducing a starting gas for H supply and a starting gas for supplying a substance for controlling electroconductivity into the deposition chamber while varying the amounts introduced, and carrying out sputtering of a target constituted of C in an atmosphere of an inert gas such as Ar, He or the like, or a gas mixture based on these gases, in said deposition chamber.

In the above processes, as the starting gas for C supply, the starting gas for H supply, and the starting gas for supplying a substance for controlling electroconductivity, substances gaseous under normal temperature and normal pressure or those gasifiable under reduced pressure can be used.

The starting material for C supply may include, for example, saturated hydrocarbons having 1 to 5 carbon atoms, ethylenic hydrocarbons having 2 to 5 carbon atoms, acetylenic hydrocarbons having 2 to 4 carbon atoms, and aromatic hydrocarbons, specifically saturated hydrocarbons such as methane ($CH_4$), ethane ($C_2H_6$), propane ($C_3H_8$), n-butane (n-$C_4H_{10}$), pentane ($C_5H_{12}$); ethylenic hydrocarbons such as ethylene ($C_2H_4$), propylene ($C_3H_6$), butene-1 ($C_4H_8$), butene-2 ($C_4H_8$), isobutylene ($C_4H_8$), pentene ($C_5H_{10}$); acetylenic hydrocarbons such as acetylene ($C_2H_2$), methylacetylene ($C_3H_4$), butyne ($C_4H_6$); aromatic hydrocarbons such as benzene or the like.

The starting gas for H supply may include, for example, hydrogen gas and hydrocarbons such as saturated hydrocarbons, ethylenic hydrocarbons, acetylenic hydrocarbons, aromatic hydrocarbons, etc. which are also the above starting materials for C supply.

The starting material for supplying a substance for controlling electroconductivity may include the exemplary compounds shown below.

Examples of the starting material for supplying the group III atoms are boron hydrides such as $B_2H_6$, $B_4H_{10}$, $B_5H_9$, $B_5H_{11}$, $B_6H_{10}$, $B_6H_{12}$, $B_6H_{14}$ or the like and boron halides such as $BF_3$, $BCl_3$, $BBr_3$ or the like for supplying boron atoms, and further $AlCl_3$, $GaCl_3$, $Ga(CH_3)_3$, $InCl_3$, $TlCl_3$ and others for supplying other atoms.

Examples of the starting material for supplying the group V atoms are phosphorus hydrides such as $PH_3$, $P_2H_4$ or the like and phosphorus halides such as $PH_4I$, $PF_3$, $PF_5$, $PCl_3$, $PCl_5$, $PBr_3$, $PBr_5$, $PI_3$ or the like for supplying phosphorus atoms, and further $AsH_3$, $AsF_3$, $AsCl_3$, $AsBr_3$, $AsF_5$, $SbH_3$, $SbF_3$, $SbF_5$, $SbCl_3$, $SbCl_5$, $BiH_3$, $BiCl_3$, $BiBr_3$ and others for supplying other atoms.

In the present invention, the distribution of hydrogen atoms and/or the substance for controlling electroconductivity in the functional thin film 4 may be nonuniform in the film thickness direction. The content of hydrogen atoms and/or the substance for controlling electroconductivity in the functional thin film 4 may be changed in a manner such that it is gradually increased from the substrate 2 side toward the surface side or, on the contrary, the content is reduced. Further, the content of hydrogen atoms and/or the substance for controlling electroconductivity in the functional thin film 4 may be changed in a manner such that it may have maximum or minimum value in the thin film 4. The change in content of hydrogen atoms and/or the substance for controlling electroconductivity in the functional thin film 4 in the film thickness direction may be selected optimally so that desired characteristics may be obtained depending on the use of the heat-generating resistor.

FIGS. 5 through 10 show examples of the changes in content of hydrogen atoms and/or the substance for controlling electroconductivity in the functional thin film 4 with respect to the film thickness direction. In these Figures, the ordinate represents the distance T from the interface with the substrate 2 in the film thickness direction, and t represents the film thickness of the functional thin film 4. On the other hand, the abscissa represents the content C of hydrogen atoms and/or the substance for controlling electroconductivity. In the respective Figures, the scales on the ordinate T and the abscissa C are not necessarily uniform, but they are changed so as to exhibit the characteristics of the respective Figures. Accordingly, in practical application, various distributions based on the difference in specific numerical values are used for respective Figures. The changes in the content of hydrogen atoms and/or the substance for controlling electroconductivity do not coincide with each other, but the respective contents may be selected depending on the desired characteristics.

In the process for forming a thin film as described above, for controlling the amount of hydrogen atoms, the amount of the substance for controlling electroconductivity, and the characteristics of the thin film 4, the substrate temperature, the amounts of the starting gases supplied, the discharging power, the pressure in the deposition chamber, and the like are adequately set.

Particularly, in order to obtain a functional thin film 4 which is nonuniform in distribution of hydrogen atoms and/or the substance for controlling electroconductivity in the film thickness direction, it is preferable to change the amounts of hydrogen atoms and/or the substance for controlling electroconductivity introduced into the deposition chamber with lapse of time by valve control or other methods.

The substrate temperature may preferably be 20° to 1500° C., more preferably 30° to 1200° C., optimally 50° to 1100° C.

The amounts of the starting gases supplied are determined suitably depending on the desired thin film performances and the desired film forming speed.

The discharging power may preferably be 0.001 to 20 W/cm$^2$, more preferably 0.01 to 15 W/cm$^2$, optimally 0.05 to 10 W/cm$^2$.

The pressure in the deposition chamber may preferably be $10^{-4}$ to 10 Torr, optimally $10^{-2}$ to 5 Torr.

The thin film in the heat-generating resistor obtained by use of the process for forming the thin film as described above has characteristics approximate to diamond. That is, for example, it has Vickers hardness of 1800 to 5000, a thermal conductivity of 0.3 to 2 cal/cm.sec.deg, and a resistivity of $10^{-3}$ to $10^6$ ohm.cm. Also, since the thin film in the heat-generating resistor of the present invention contains hydrogen atoms, film formation can be done with ease.

The resistor of the present invention can also be provided with a layer having suitable functions such as protection or other functions, as a matter of course.

Figure 2:
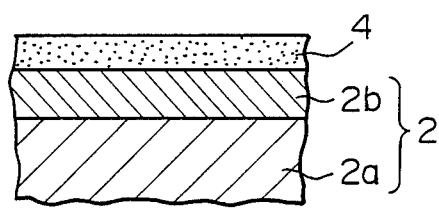

Having described above with reference to a single substrate 2, the substrate 2 may also be a composite material. An example of such an embodiment is shown in FIG. 2. That is, the substrate 2 comprises a composite material of a base portion 2a and a surface layer 2b, and the substrate material described with reference to the above FIG. 1, for example, can be used as the base portion 2a, while a material having good adhesiveness with the functional thin film 4 to be formed thereon can be used as the surface layer 2b. The surface layer 2b may be constituted of, for example, an amorphous material made of a matrix of carbon atoms or an oxide conventionally known in the art. Such a surface layer 2b can be obtained by use of a suitable starting material by depositing it according to the process similar to the above-described thin film forming process. Also, the surface layer 2b may be a glaze layer of a conventional glassy material.

Next, a schematic explanation of the process for producing the heat-generating resistor of the present invention is given.

Figure 3:
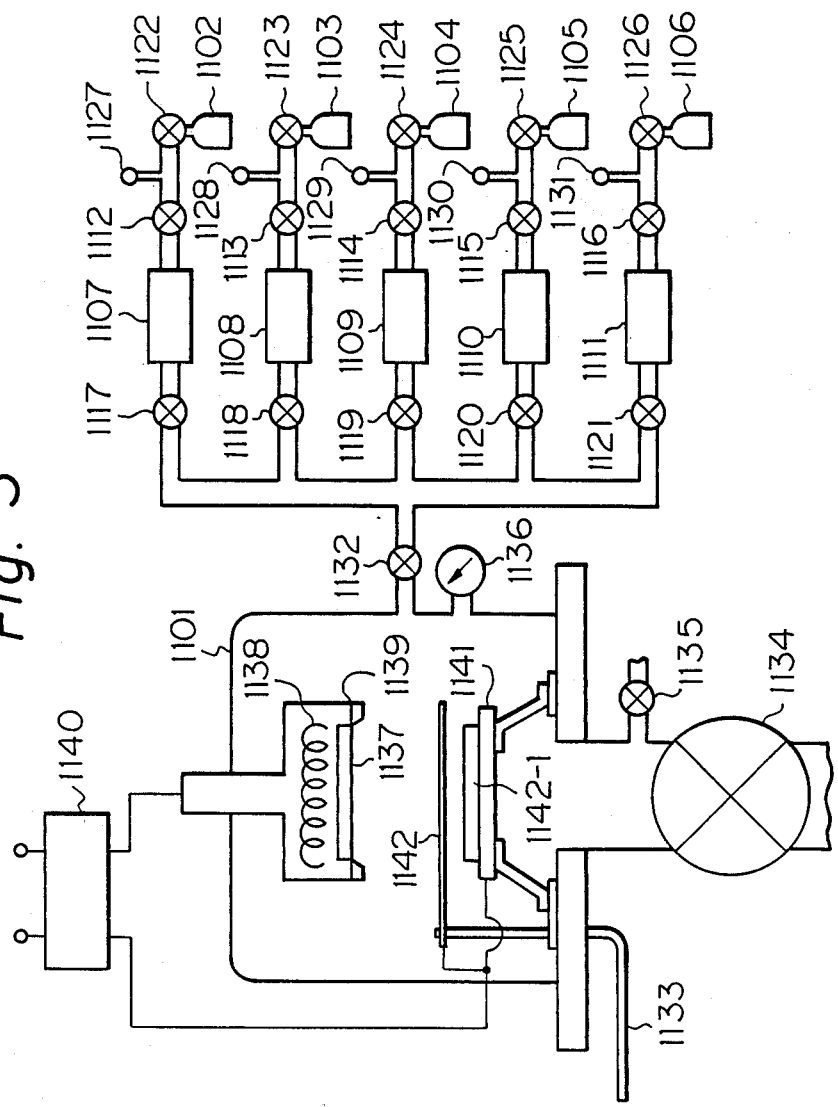
FIG. 3 is an illustration of the device to be used for preparation of the heat-generating resistor of the present invention.
Figure 5:
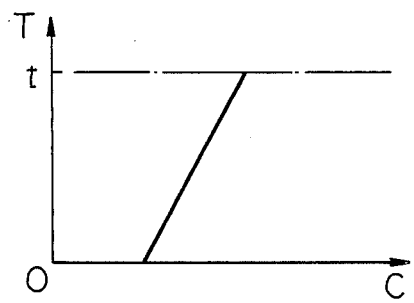
FIG. 5 to FIG. 10 are graphs showing distribution of the content of hydrogen atoms and/or a substance for controlling electroconductivity in the functional thin film.
Figure 6:
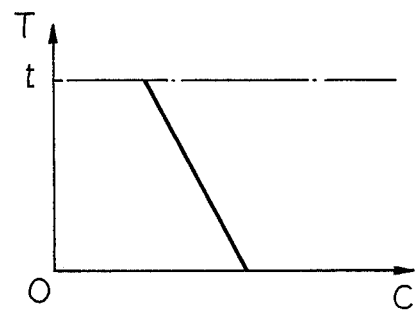
Figure 7:
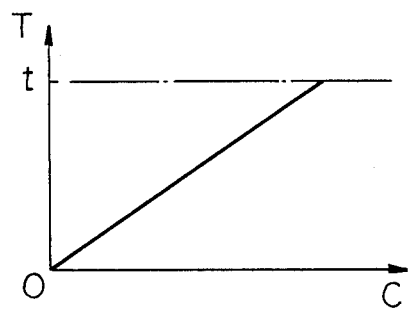
Figure 8:
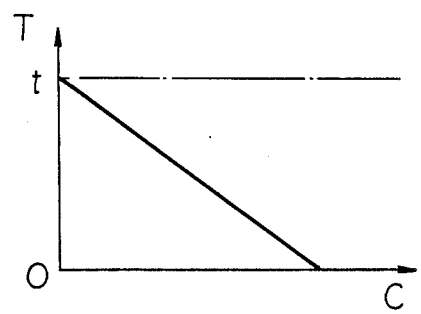
Figure 9:
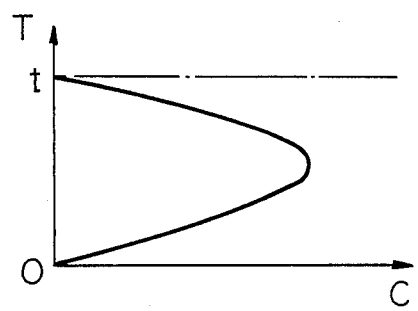
Figure 10:
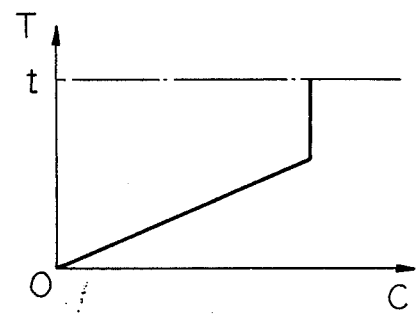

FIG. 3 is an illustration showing an example of the device to be used during formation of the functional thin film on the substrate surface. 1101 is a deposition chamber, 1102 to 1106 are gas bombs, 1107 to 1111 are mass flow controllers, 1112 to 1116 are inflow valves, 1117 to 1121 are outflow valves, 1122 to 1126 are valves for gas bombs, 1127 to 1131 are outlet pressure gauges, 1132 is an auxiliary valve, 1133 is a lever, 1134 is a main valve, 1135 is a leak valve, 1136 is a vacuum gauge, 1137 is a substrate material of the resistor to be prepared, 1138 is a heater, 1139 is a substrate supporting member, 1140 is a high voltage power source, 1141 is an electrode, and 1142 is a shutter. 1142-1 is a target which is mounted on the electrode 1141 in carrying out the sputtering method.

For example, 1102 is hermetically filled with CH$_4$ gas (purity: 99.9% or higher), and 1103 hermetically filled with C$_2$H$_6$ gas (purity: 99.9% or higher). Prior to inflow of the gases in these bombs, while confirming that the valves 1122 to 1126 for the respective bombs 1102 to 1106 and the leak valve 1135 are closed, and also confirming that the inflow valves 1112 to 1116, the outflow valves 1117 to 1121, and the auxiliary valve 1132 are opened, first the main valve 1134 is opened to evacuate internally the deposition chamber 1101 and the gas pipelines. Next, when the reading on the vacuum gauge 1136 becomes about $1.5 \times 10^{-6}$ Torr, the auxiliary valve 1132, the inflow valves 1112 to 1116, and the outflow valves 1117 to 1121 are closed. Then, the valves of the gas pipelines connected to the bombs of the gases to be introduced into the deposition chamber 1101 are opened to introduce the desired gases into the deposition chamber 1101.

Next, an example of the procedure when preparing the resistor of the present invention according to the glow discharge method by use of the above device is described. By opening the valve 1122, CH$_4$ gas is permitted to flow out from the gas bomb 1102, and then with adjustment of the outlet pressure gauge 1127 to 1 kg/cm$^2$, to flow into the mass flow controller 1107 by opening gradually the inflow valve 1112. Subsequently, by opening gradually the inflow valve 1117 and the auxiliary valve 1132, CH$_4$ gas is introduced into the deposition chamber 1101. During this operation, the mass flow controller 1107 is adjusted so that the flow rate of CH$_4$ gas may become a desired value, and also the opening of the main valve 1134 is adjusted while watching the reading on the vacuum gauge 1136 so that the pressure in the deposition chamber 1101 may become a desired value. And, after the substrate 1137 supported by the supporting member 1139 in the deposition chamber 1101 is heated by the heater 1138 to a desired temperature, the shutter 1142 is opened and glow discharging is excited in the deposition chamber 1101.

When the content of hydrogen atoms is changed in the layer thickness direction, in the above preparation method, after the substrate 1137 supported by the supporting member 1139 in the deposition chamber 1101 is heated by the heater 1138 to a desired temperature, while exciting glow discharging with opening of the shutter 1142, the operation of changing the opening of the outflow valve 1117 may be performed manually or by means of an externally driven motor, etc. to change the flow rate of $CH_4$ gas with lapse of time following the change rate curve previously designed, thereby changing the content of H atoms in the functional thin film 4 in the film thickness direction.

Next, an example of the procedure when preparing the resistor of the present invention according to the sputtering method by use of the above device is described. On the electrode 1141 to which high voltage is to be applied from the high voltage power source 1140, a high purity graphite 1142-1 is previously disposed as the target. Similarly to in the case of the glow discharge method, $CH_4$ gas is introduced from the gas bomb 1102 into the deposition chamber 1101 at a desired flow rate. By charging the high voltage power source 1140 with opening of the shutter 1142, the target 1142-1 is subjected to sputtering. The operations of heating the substrate 1137 to a desired temperature by the heater 1138 and adjusting internally the deposition chamber 1101 to a desired pressure by controlling the opening of the main valve 1134 are the same as in the case of the glow discharge method.

When the content of hydrogen atoms is changed in the layer thickness direction by use of the sputtering method, for example, during layer formation according to the above sputtering method, the operation of changing the opening of the outflow valve 1117 may be performed similarly to the case of the above glow discharge method to change the flow rate of $CH_4$ gas with lapse of time following the change rate curve previously designed, thereby changing the content of H atoms in the functional thin film 4 in the film thickness direction.

Next, a schematic explanation of the process for producing the heat-generating resistor of the present invention containing hydrogen atoms and a substance for controlling electroconductivity is given.

FIG. 3 is an illustration showing an example of the device to be used during formation of the functional thin film on the substrate surface. 1101 is a deposition chamber, 1102 to 1106 are gas bombs, 1107 to 1111 are mass flow controllers, 1112 to 1116 are inflow valves, 1117 to 1121 are outflow valves, 1122 to 1126 are valves for gas bombs, 1127 to 1131 are outlet pressure gauges, 1132 is an auxiliary valve, 1133 is a lever, 1134 is a main valve, 1135 is a leak valve, 1136 is a vacuum gauge, 1137 is a substrate material of the resistor to be prepared, 1138 is a heater, 1139 is a substrate supporting member, 1140 is a high voltage power source, 1141 is an electrode, and 1142 is a shutter. 1142-1 is a target which is mounted on the electrode 1141 in carrying out the sputtering method.

For example, 1102 is hermetically filled with $CH_4$ gas (purity: 99.9% or higher) diluted with Ar gas, 1103 hermetically filled with $PH_3$ gas (purity: 99.9% or higher) diluted with Ar gas, and 1104 hermetically filled with $B_2H_6$ gas (purity: 99.9% or higher) diluted with Ar gas. Prior to inflow of the gases in these bombs, while confirming that the valves 1122 to 1126 for the respective bombs 1102 to 1106 and the leak valve 1135 are closed, and also confirming that the inflow valves 1112 to 1116, the outflow valves 1117 to 1121, and the auxiliary valve 1132 are opened, first the main valve 1134 is opened to evacuate internally the deposition chamber 1101 and the gas pipelines. Next, when the reading on the vacuum gauge 1136 becomes about $1.5 \times 10^{-6}$ Torr, the auxiliary valve 1132, the inflow valves 1112 to 1116, and the outflow valves 1117 to 1121 are closed. Then, the valves of the gas pipelines connected to the bombs of the gases to be introduced into the deposition chamber 1101 are opened to introduce the desired gas into the deposition chamber 1101.

Next, an example of the procedure when preparing the resistor of the present invention according to the glow discharge method by use of the above device is described. By opening the valve 1122, $CH_4$/Ar gas is permitted to flow out from the gas bomb 1102 and $PH_3$/Ar gas from the gas bomb 1103, and then with adjustment of the outlet pressure gauges 1127 and 1128 to 1 kg/cm², to flow into the mass flow controllers 1107 and 1108 by opening gradually the inflow valves 1112 and 1113. Subsequently, by opening gradually the inflow valves 1117, 1118, and the auxiliary valve 1132, $CH_4$/Ar gas and $PH_3$/Ar gas are introduced into the deposition chamber 1101. During this operation, the mass flow controllers 1107 and 1108 are adjusted so that the ratio of the flow rate of $CH_4$/Ar gas to the flow rate of $PH_3$/Ar gas may become a desired value, and also the opening of the main valve 1134 is adjusted while watching the reading on the vacuum gauge 1136 so that the pressure in the deposition chamber 1101 may become a desired value. And, after the substrate 1137 supported by the supporting member 1139 in the deposition chamber 1101 is heated by the heater 1138 to a desired temperature, the shutter 1142 is opened and glow discharging is excited in the deposition chamber 1101.

When the content of hydrogen atoms and/or a substance for controlling electroconductivity is changed in the layer thickness direction, the operation of changing the openings of the outflow valves 1117 and 1118 may be performed manually or by means of an externally driven motor, etc. to change the flow rate of $CH_4$/Ar gas and/or flow rate of $PH_3$/Ar gas with lapse of time following the change rate curve previously designed.

Next, an example of the procedure when preparing the resistor of the present invention according to the sputtering method by use of the above device is described. On the electrode 1141 to which high voltage is to be applied from the high voltage power source 1140, a high purity graphite 1142-1 is previously disposed as the target. Similar to in the case of the glow discharge method, $CH_4$/Ar gas from the gas bomb 1102 and $PH_3$/Ar gas from the gas bomb 1103 are introduced into the deposition chamber 1101 at respective desired flow rates. By charging the high voltage power source 1140 with opening of the shutter 1142, the target 1142-1 is subjected to sputtering. The operations of heating the substrate 1137 to a desired temperature by the heater 1138 and adjusting internally the deposition chamber 1101 to a desired pressure by controlling the opening of the main valve 1134 are the same as in the case of the glow discharge method.

When the content of hydrogen atoms and/or a substance for controlling electroconductivity is changed in the layer thickness direction, for example, similar to the case of the above glow discharge method, the operation of changing the openings of the outflow valves 1117 and 1118 may be performed similarly to the case of the above glow discharge method to change the flow rate of $CH_4/Ar$ gas and the flow rate of $PH_3/Ar$ gas with lapse of time following the change rate curves previously designed.

According to the present invention as described above, by use of an amorphous material containing hydrogen atoms in a matrix of carbon atoms as the functional thin film, there is provided a heat-generating resistor which is markedly good in heat response, heat conductivity, heat resistance and/or durability. Also, the functional thin film of the present invention can be formed with ease.

Further, by use of an amorphous material containing hydrogen atoms and a substance for controlling electroconductivity in a matrix of carbon atoms, there is provided a heat-generating resistor which is markedly good in controllability of resistance valve in addition to the above effects.

In addition, by making the hydrogen atoms and/or a substance for controlling electroconductivity nonuniformly distributed in the film thickness direction, various characteristics such as heat accumulability, heat dissipatability, adhesiveness between the substrate and the functional thin film, etc. can be realized with ease.

In the following, specific examples of the heat-generating resistor of the present invention are shown.

EXAMPLE 1

By use of an alumina ceramic plate as a substrate, a heat-generating resistance layer which is a functional thin film was formed on the surface of said substrate. Deposition of the heat-generating resistance layer was carried out according to the glow discharge method by use of a device shown in FIG. 3. As the starting gas, $CH_4$ was employed. The conditions during deposition are as shown in Table 1. During deposition, the degree of opening of the respective valves and other conditions were maintained constant, and the heat-generating resistance layer with a thickness shown in Table 1 was formed.

After an aluminum layer was formed on the thus obtained resistance layer according to the electron beam vapor deposition method, said aluminum layer was etched by photolithographic technique to a desired shape to form plural pairs of electrodes.

Figure 4:
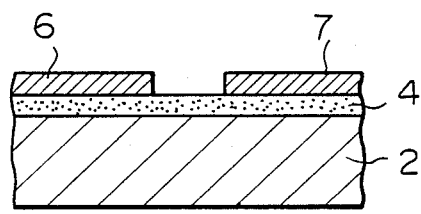
FIG. 4 is a partial sectional view of the heat-generating resistance device prepared in Examples of the present invention.

Subsequently, the resistance layer at a predetermined portion was removed by use of an HF type etchant according to photolithographic technique. In this Example, the size of the resistance layer lying between the above electrode pair was made 100 $\mu m \times 100$ $\mu m$. In this Example, a plural number of heat-generating resistance devices were prepared on the substrate so that the heat-generating elements formed between the electrode pairs may be arranged at 8 pitches/mm. FIG. 4 shows a partial sectional view of the thus prepared heat-generating resistance device. In the Figure, 2 is a substrate, 4 is a heat-generating resistance layer, and 6, 7 are a pair of electrodes.

Electric resistance of each heat-generating device thus obtained was measured to be 80 ohm.

Also, durability of said heat-generating resistance device was measured by inputting electrical pulse signals into the heat-generating resistance device obtained according to this Example. For the electrical pulse signal, its duty was made 50%, application voltage 20 V, and the driving frequencies 0.5 kHz, 1.0 kHz, and 2.0 kHz.

As a result, the heat-generating resistance device was not destroyed even when the number of electrical pulse signal inputting reached $1 \times 10^{10}$ times in every case of driving at different driving frequencies, and its resistance value was substantially unchanged.

EXAMPLE 2

A heat-generating resistance layer with the same thickness was deposited in the same manner as in Example 1 except for changing the starting gas to $C_2H_6$ and the discharging power to 1.5 $W/cm^2$.

Next, when a heat-generating resistance device was prepared and electrical pulse signal was inputted therein in the same manner as Example 1, the heat-generating resistance device was not destroyed even when the number of electrical pulse signal inputting reached $1 \times 10^{10}$ times. Also, no change in resistance value was recognized.

EXAMPLE 3

A heat-generating resistance device was prepared by depositing a heat-generating resistance layer in the same manner as in Example 1 except for changing the substrate to #7059 glass produced by Corning Co.

When the thus obtained heat-generating resistance device was driven in the same manner as Example 1, it was confirmed that it had satisfactory durability similar to Example 1.

EXAMPLE 4

A heat-generating resistance device was prepared by depositing a heat-generating resistance layer in the same manner as in Example 2 except for changing the substrate to #7059 glass produced by Corning Co.

When the thus obtained heat-generating resistance device was driven in the same manner as Example 2, it was confirmed that it had satisfactory durability similar to Example 2.

EXAMPLE 5

By use of an alumina ceramic plate as a substrate, a heat-generating resistance layer which is a functional thin film was formed on the surface of said substrate. Deposition of the heat-generating resistance layer was carried out according to the sputtering method by use of a device shown in FIG. 3. As the target for sputtering, a graphite having a purity of 99.9% or higher was employed, and as the starting gas, $CH_4$ was employed. The conditions during deposition were as shown in Table 1. The gas pressure in the deposition chamber during sputtering was $4 \times 10^{-2}$ Torr. During deposition, the degree of opening of the respective valves and other conditions were maintained constant, and the heat-generating resistance layer with a thickness shown in Table 1 was formed.

By use of the thus prepared resistance layer, a heat-generating resistance device was prepared and further electrical pulse signal was inputted therein in the same manner as in Example 1, and it was confirmed to be excellent in durability similar to Example 1.

TABLE 1

| Example No. | Starting material | Gas flow rate (SCCM) | Discharging power (W/cm$^2$) | Substrate temperature (°C.) | Film thickness (Å) |
|---|---|---|---|---|---|
| 1 | CH$_4$ | 50 | 0.8 | 350 | 3000 |
| 2 | C$_2$H$_6$ | 50 | 1.5 | 350 | 3000 |
| 3 | CH$_4$ | 50 | 0.8 | 350 | 3000 |
| 4 | C$_2$H$_6$ | 50 | 1.5 | 350 | 3000 |
| 5 | CH$_4$ | 20 | 13 | 350 | 3000 |

EXAMPLE 6

A plural number of heat-generating elements were prepared in the same manner as in Example 1 except for changing the flow rate of CH$_4$ gas by changing continuously the degree of opening of the valve during formation of the heat-generating resistance layer. The conditions during deposition were as shown in Table 2.

Electric resistance of each heat-generating device thus obtained was measured to be 85 ohm.

Also, durability of said heat-generating resistance device was measured by inputting electrical pulse signals into the heat-generating resistance device obtained according to this Example. For the electrical pulse signal, its duty was made 50%, application voltage 20 V, and the driving frequencies 0.5 kHz, 1.0 kHz, and 2.0 kHz.

As a result, the heat-generating resistance device was not destroyed even when the number of electrical pulse signal inputting reached $1 \times 10^{10}$ times in every case of driving at different driving frequencies, and its resistance value was substantially unchanged.

EXAMPLE 7

A heat-generating resistance layer with the same thickness was deposited in the same manner as in Example 6 except for changing the starting gas to C$_2$H$_6$ and the discharging power to 1.5 W/cm$^2$.

Next, when a heat-generating resistance device was prepared and electrical pulse signal was inputted therein in the same manner as in Example 6, the heat-generating resistance device was not destroyed even when the number of electrical pulse signal inputting reached $1 \times 10^{10}$ times. Also, no change in resistance value was recognized.

EXAMPLE 8

A heat-generating resistance device was prepared by depositing a heat-generating resistance layer in the same manner as in Example 6 except for changing the substrate to #7059 glass produced by Corning Co. and changing the flow rate of CH$_4$ gas.

When the thus obtained heat-generating resistance device was driven in the same manner as in Example 6, it was confirmed that it had satisfactory durability similar to Example 6.

EXAMPLE 9

A heat-generating resistance device was prepared by depositing a heat-generating resistance layer in the same manner as in Example 7 except for changing the substrate to #7059 glass produced by Corning Co. and changing the flow rate of C$_2$H$_6$ gas.

When the thus obtained heat-generating resistance device was driven in the same manner as in Example 7, it was confirmed that it had satisfactory durability similar to Example 7.

EXAMPLE 10

A heat-generating element was prepared in the same manner as in Example 5 except for changing the flow rate of CH$_4$ gas by changing continuously the degree of opening of the valve during formation of the heat-generating resistance layer. The conditions during deposition were as shown in Table 2.

By use of the thus prepared resistance layer, a heat-generating resistance device was prepared and further electrical pulse signal was inputted therein in the same manner as in Example 6, and it was confirmed to be excellent in durability similar to Example 6.

TABLE 2

| Example No. | Starting material | Gas flow rate (SCCM) | Discharging power (W/cm$^2$) | Substrate temperature (°C.) | Film thickness (Å) |
|---|---|---|---|---|---|
| 6 | CH$_4$ | 50 → 20 | 0.8 | 350 | 3000 |
| 7 | C$_2$H$_6$ | 50 → 20 | 1.5 | 350 | 3000 |
| 8 | CH$_4$ | 20 → 50 | 0.8 | 350 | 3000 |
| 9 | C$_2$H$_6$ | 20 → 50 | 1.5 | 350 | 3000 |
| 10 | CH$_4$ | 20 → 10 | 13 | 350 | 3000 |

EXAMPLE 11

A heat-generating resistance device was prepared in the same manner as in Example 1 except for using CH$_4$/Ar=0.5 (volume ratio) and PH$_3$/Ar=1000 ppm (volume ratio) as the starting gases and changing the conditions during deposition as shown in Table 3.

Electric resistance of each heat-generating device thus obtained was measured to be 75 ohm.

Also, durability of said heat-generating resistance device was measured by inputting electrical pulse signals into the heat-generating resistance device obtained according to this Example. For the electrical pulse signal, its duty was made 50%, application voltage 20 V, and the driving frequencies 0.5 kHz, 1.0 kHz, and 20 kHz.

As a result, the heat-generating resistance device was not destroyed even when the number of electrical pulse signal inputting reached $1 \times 10^{10}$ times in every case of driving at different driving frequencies, and its resistance value was substantially unchanged.

EXAMPLE 12

A heat-generating resistance layer with the same thickness was deposited in the same manner as in Example 11 except for changing the starting gases to CH$_4$/Ar=0.5 (volume ratio) and B$_2$H$_6$/Ar=1000 ppm (volume ratio).

Next, when a heat-generating resistance device was prepared and electrical pulse signal was inputted therein in the same manner as in Example 11, the heat-generating resistance device was not destroyed even when the number of electrical pulse signal inputting reached $1 \times 10^{10}$ times. Also, no change in resistance value wa recognized.

EXAMPLE 13

A heat-generating resistance device was prepared by depositing a heat-generating resistance layer in the same manner as in Example 11 except for changing the substrate to #7059 glass produced by Corning Co.

When the thus obtained heat-generating resistance device was driven in the same manner as in Example 11, it was confirmed that it had satisfactory durability similar to Example 11.

EXAMPLE 11

A heat-generating resistance device was prepared by depositing a heat-generating resistance layer in the same manner as in Example 12 except for changing the substrate to #7059 glass produced by Corning Co.

When the thus obtained heat-generating resistance device was driven in the same manner as in Example 12, it was confirmed that it had satisfactory durability similar to Example 12.

TABLE 3

| Example No. | Starting material | Gas flow rate (SCCM) | Discharging power (W/cm$^2$) | Substrate temperature (°C.) | Film thickness (Å) |
|---|---|---|---|---|---|
| 11 | CH$_4$/Ar = 0.5 | 50 | 1.5 | 350 | 3000 |
|  | PH$_3$/Ar = 1000 ppm | 125 |  |  |  |
| 12 | CH$_4$/Ar = 0.5 | 50 | 1.5 | 350 | 3000 |
|  | B$_2$H$_6$/Ar = 1000 ppm | 125 |  |  |  |
| 13 | CH$_4$/Ar = 0.5 | 50 | 1.5 | 350 | 3000 |
|  | PH$_3$/Ar = 1000 ppm | 125 |  |  |  |
| 14 | CH$_4$/Ar = 0.5 | 50 | 1.5 | 350 | 3000 |
|  | B$_2$H$_6$/Ar = 1000 ppm | 125 |  |  |  |

EXAMPLE 15

Heat-generating resistance devices were prepared in the same manner as in Example 11 except for changing the flow rate of CH$_4$/Ar gas by changing continuously the degree of opening of the valve during formation of the heat-generating resistance layer. The conditions during deposition were as shown in Table 4.

Electric resistance of each heat-generating device thus obtained was measured to be 80 ohm.

Also, durability of said heat-generating resistance device was measured by inputting electrical pulse signals into the heat-generating resistance device obtained according to this Example. For the electrical pulse signal, its duty was made 50%, application voltage 20 V, and the driving frequencies 0.5 kHz, 1.0 kHz, and 2.0 kHz.

As a result, the heat-generating resistance device was not destroyed even when the number of electrical pulse signal inputting reached 1×10$^{10}$ times in every case of driving at different driving frequencies, and its resistance value was substantially unchanged.

EXAMPLE 16

A heat-generating resistance layer with the same thickness was deposited in the same manner as in Example 15 except for changing the starting gases to CH$_4$/Ar=0.5 (volume ratio) and B$_2$H$_6$/Ar=1000 ppm (volume ratio).

Next, when a heat-generating resistance device was prepared and electrical pulse signal was inputted therein in the same manner as in Example 11, the heat-generating resistance device was not destroyed even when the number of electrical pulse signal inputting reached 1×10$^{10}$ times. Also, no change in resistance value was recognized.

EXAMPLE 17

A heat-generating resistance device was prepared by depositing a heat-generating resistance layer in the same manner as in Example 15 except for maintaining the CH$_4$/Ar gas flow rate constant and changing continuously the discharging power.

When the thus obtained heat-generating resistance device was driven in the same manner as in Example 15, it was confirmed that it had satisfactory durability similar to Example 15.

EXAMPLE 18

A heat-generating resistance device was prepared by depositing a heat-generating resistance layer in the same manner as in Example 16 except for maintaining the CH$_4$/Ar gas flow rate constant and changing continuously the discharging power.

When the thus obtained heat-generating resistance device was driven in the same manner as in Example 16, it was confirmed that it had satisfactory durability similarly as to in Example 16.

TABLE 4

| Example No. | Starting material | Gas flow rate (SCCM) | Discharging power (W/cm$^2$) | Substrate temperature (°C.) | Film thickness (Å) |
|---|---|---|---|---|---|
| 15 | CH$_4$/Ar = 0.5 | 50 → 30 | 1.5 | 350 | 3000 |
|  | PH$_3$/Ar = 1000 ppm | 125 |  |  |  |
| 16 | CH$_4$/Ar = 0.5 | 50 → 30 | 1.5 | 350 | 3000 |
|  | B$_2$H$_6$/Ar = 1000 ppm | 125 |  |  |  |
| 17 | CH$_4$/Ar = 0.5 | 50 | 1.5 → 1.6 | 350 | 3000 |
|  | PH$_3$/Ar = 1000 ppm | 125 |  |  |  |
| 18 | CH$_4$/Ar = 0.5 | 50 | 1.5 → 1.6 | 350 | 3000 |
|  | B$_2$H$_6$/Ar = 1000 ppm | 125 |  |  |  |

What is claimed is:

1. A heat-generating resistor having a functional thin film comprising an amorphous material containing hydrogen atoms in a matrix of carbon atoms formed on a substrate, wherein said hydrogen atoms are distributed non-uniformly in the film thickness direction.

2. A heat-generating resistor according to claim 1, wherein the content of hydrogen atoms in the functional thin film is 0.0001 to 30 atomic %.

3. A heat-generating resistor according to claim 1, wherein the substrate has a surface layer comprising an amorphous material of a matrix of carbon atoms on the side on which the functional thin film is formed.

4. A heat-generating resistor according to claim 1, wherein said hydrogen atoms are distributed with greater content on the side of said substrate.

5. A heat-generating resistor according to claim 1, wherein said hydrogen atoms are distributed with smaller content on the side of said substrate.

6. A heat-generating resistor according to claim 1, wherein said hydrogen atoms are distributed with greater content in the central portion in the layer thickness direction.

7. A heat-generating resistor according to claim 1, wherein said functional thin film further contains a substance for controlling electroconductivity.

8. A heat-generating resistor according to claim 7, wherein the content of hydrogen atoms in the functional thin film is 0.0001 to 30 atomic %.

9. A heat-generating resistor according to claim 7, wherein the content of the substance for controlling electroconductivity is 0.01 to 50000 atomic ppm.

10. A heat-generating resistor according to claim 7, wherein the substance for controlling electroconductivity is an atom belonging to the group III of the periodic table.

11. A heat-generating resistor according to claim 7, wherein the substance for controlling electroconductivity is an atom belonging to the group V of the periodic table.

12. A heat-generating resistor according to claim 7, wherein the substrate has a surface layer comprising an amorphous material of a matrix of carbon atoms on the side on which the functional thin film is formed.

13. A heat-generating resistor according to claim 7, wherein the substance for controlling electroconductivity is distributed nonuniformly in the film thickness direction.

14. A heat-generating resistor according to claim 13, wherein the content of hydrogen atoms in the functional thin film is 0.0001 to 30 atomic %.

15. A heat-generating resistor according to claim 13, wherein the content of the substance for controlling electroconductivity is 0.01 to 50000 atomic ppm.

16. A heat-generating resistor according to claim 13, wherein the substance for controlling electroconductivity is an atom belonging to the group III of the periodic table.

17. A heat-generating resistor according to claim 13, wherein the substance for controlling electroconductivity is an atom belonging to the group V of the periodic table.

18. A heat-generating resistor according to claim 13, wherein the substrate has a surface layer comprising an amorphous material of a matrix of carbon atoms on the side on which the functional thin film is formed.

19. A heat-generating resistor according to claim 4, wherein the distribution concentration of said hydrogen atoms is gradually decreased from the substrate side.

20. A heat-generating resistor according to claim 4, wherein the distribution concentration of said hydrogen atoms is gradually increased from the substrate side.

21. A heat-generating resistor according to claim 13, wherein said hydrogen atoms and/or the substance for controlling electroconductivity are distributed with greater content on the side of said substrate.

22. A heat-generating resistor according to claim 13, wherein said hydrogen atoms and/or the substance for controlling electroconductivity are distributed with smaller content on the side of said substrate.

23. A heat-generating resistor according to claim 13, wherein said hydrogen atoms and/or the substance for controlling electroconductivity are distributed with greater content in the central portion in the layer thickness direction.

24. A heat-generating resistor according to claim 13, wherein the distribution concentration of said hydrogen atoms and/or the substance for controlling electroconductivity is gradually decreased from the substrate side.

25. A heat-generating resistor according to claim 13, wherein the distribution concentration of said hydrogen atoms and/or the substance for controlling electroconductivity is gradually increased from the substrate side.

26. A heat-generating resistance device having a functional thin film and a pair of electrodes electrically connected to said thin film, said thin film being a heat-generating resistor comprising an amorphous material containing hydrogen atoms in a matrix of carbon atoms formed on a substrate, wherein said hydrogen atoms are distributed non-uniformly in the film thickness direction.

27. A heat-generating resistance device according to claim 26, wherein the content of hydrogen atoms in the functional thin film is 0.0001 to 30 atomic %.

28. A heat-generating resistance device according to claim 26, wherein the substrate has a surface layer comprising an amorphous material of a matrix of carbon atoms on the side on which the functional thin film is formed.

29. A heat-generating resistance device according to claim 28, wherein a substance for controlling electroconductivity is nonuniformly distributed in the film thickness direction.

30. A heat-generating resistance device according to claim 29, wherein the content of hydrogen atoms in the functional thin film is 0.0001 to 30 atomic %.

31. A heat-generating resistance device according to claim 29, wherein the content of the substance for controlling electroconductivity is 0.01 to 50000 atomic ppm.

32. A heat-generating resistance device according to claim 29, wherein the substance for controlling electroconductivity is an atom belonging to the group III of the periodic table.

33. A heat-generating resistance device according to claim 29, wherein the substance for controlling electroconductivity is an atom belonging to the group V of the periodic table.

34. A heat-generating resistance device according to claim 29, wherein the substate has a surface layer comprising an amorphous material of a matrix of carbon atoms on the side on which the functional thin film is formed.

35. A heat-generating resistance device according to claim 26, wherein said functional thin film further contains a substance for controlling electroconductivity.

36. A heat-generating resistance device according to claim 35, wherein the content of hydrogen atoms in the functional thin film is 0.0001 to 30 atomic %.

37. A heat-generating resistance device according to claim 35, wherein the content of the substance for controlling electroconductivity is 0.01 to 50000 atomic ppm.

38. A heat-generating resistance device according to claim 35, wherein the substance for controlling electroconductivity is an atom belonging to the group III of the periodic table.

39. A heat-generating resistance device according to claim 35, wherein the substance for controlling electroconductivity is an atom belonging to the group V of the periodic table.

40. A heat-generating resistance device according to claim 35, wherein the substrate has a surface layer comprising an amorphous material of a matrix of carbon atoms on the side on which the functional thin film is formed.

41. A heat-generating resistance device according to claim 23, wherein said hydrogen atoms are distributed with greater content on the side of said substrate.

42. A heat-generating resistance device according to claim 23, wherein said hydrogen atoms are distributed with smaller content on the side of said substrate.

43. A heat-generating resistance device according to claim 23, wherein said hydrogen atoms are distributed with greater content in the central portion in the layer thickness direction.

44. A heat-generating resistance device according to claim 23, wherein the distribution concentration of said hydrogen atoms is gradually decreased from the substrate side.

45. A heat-generating resistance device according to claim 23, wherein the distribution concentration of said hydrogen atoms is gradually increased from the substrate side.

46. A heat-generating resistance device according to claim 26, wherein said hydrogen atoms and/or the substance for controlling electroconductivity are distributed with greater content on the side of said substrate.

47. A heat-generating resistance device according to claim 26, wherein said hydrogen atoms and/or the substance for controlling electroconductivity are distributed with smaller content on the side of said substrate.

48. A heat-generating resistance device according to claim 26, wherein said hydrogen atoms and/or the substance for controlling electroconductivity are distributed with greater content in the central portion in the layer thickness direction.

49. A heat-generating resistance device according to claim 26, wherein the distribution concentration of said hydrogen atoms and/or the substance for controlling electroconductivity is gradually decreased from the substrate side.

50. A heat-generating resistance device according to claim 26, wherein the distribution concentration of said hydrogen atoms and/or the substance for controlling electroconductivity is gradually increased from the substrate side.

* * * * *

UNITED STATES PATENT AND TRADEMARK OFFICE
CERTIFICATE OF CORRECTION

PATENT NO. : 4,851,808
DATED : July 25, 1989
INVENTOR(S) : MASAO SUGATA, ET AL.

It is certified that error appears in the above-identified patent and that said Letters Patent is hereby corrected as shown below:

COLUMN 5

Line 30, "atoms" should read --atoms,--.

COLUMN 7

Line 26, "in" should be deleted.

COLUMN 8

Line 59, "in" should be deleted.

COLUMN 9

Line 25, "resistance valve" should read --resistance value--.

COLUMN 12

Line 59, "wa" should read --was--.

COLUMN 13

Line 4, "EXAMPLE 11" should read --EXAMPLE 14--.

COLUMN 14

Line 22, "larly as to in" should read --lar to--.

COLUMN 16

Line 20, "claim 28," should read --claim 35,--.
    Line 39, "substate" should read --substrate--.
    Line 67, "claim 23," should read --claim 26,--.

UNITED STATES PATENT AND TRADEMARK OFFICE
CERTIFICATE OF CORRECTION

PATENT NO. : 4,851,808
DATED : July 25, 1989
INVENTOR(S) : MASAO SUGATA, ET AL.

Page 2 of 2

It is certified that error appears in the above-identified patent and that said Letters Patent is hereby corrected as shown below:

COLUMN 17

Line 2, "claim 23," should read --claim 26,--.
Line 5, "claim 23," should read --claim 26,--.
Line 9, "claim 23," should read --claim 26,--.
Line 13, "claim 23," should read --claim 26,--.
Line 17, "claim 26," should read --claim 29,--.

COLUMN 18

Line 2, "claim 26," should read --claim 29,--.
Line 6, "claim 26," should read --claim 29,--.
Line 12, "claim 26," should read --claim 29,--.
Line 16, "claim 26," should read --claim 29,--.

Signed and Sealed this

Twenty-seventh Day of November, 1990

Attest:

HARRY F. MANBECK, JR.

*Attesting Officer*     *Commissioner of Patents and Trademarks*